US 11,670,613 B2

(12) United States Patent
Tuominen et al.

(10) Patent No.: US 11,670,613 B2
(45) Date of Patent: Jun. 6, 2023

(54) ARRANGEMENT WITH CENTRAL CARRIER AND TWO OPPOSING LAYER STACKS, COMPONENT CARRIER AND MANUFACTURING METHOD

(71) Applicant: AT&S (China) Co. Ltd., Shanghai (CN)

(72) Inventors: Mikael Tuominen, Pernio (FI); Nick Xin, Shanghai (CN); Seok Kim Tay, Singapore (SG)

(73) Assignee: AT&S (China) Co. Ltd., Shanghai (CN)

( * ) Notice: Subject to any disclaimer, the term of this patent is extended or adjusted under 35 U.S.C. 154(b) by 130 days.

(21) Appl. No.: 17/247,504

(22) Filed: Dec. 14, 2020

(65) Prior Publication Data

US 2021/0202427 A1 Jul. 1, 2021

(30) Foreign Application Priority Data

Dec. 31, 2019 (CN) .......................... 201911412392.1

(51) Int. Cl.
*H01L 21/683* (2006.01)
*H01L 23/00* (2006.01)
*H01L 25/065* (2023.01)

(52) U.S. Cl.
CPC .......... *H01L 24/25* (2013.01); *H01L 21/6835* (2013.01); *H01L 24/82* (2013.01);
(Continued)

(58) Field of Classification Search
CPC ..... H01L 24/25; H01L 21/6835; H01L 24/82; H01L 25/0657; H01L 2221/68359;
(Continued)

(56) References Cited

U.S. PATENT DOCUMENTS 8,181,342 B2 * 5/2012 Chiang ................ H05K 3/4682
29/830
8,264,849 B2 * 9/2012 Guzek .................... H01L 24/20
29/841

(Continued)

FOREIGN PATENT DOCUMENTS

CN 101128091 A 2/2008
CN 103378014 A 10/2013
(Continued)

OTHER PUBLICATIONS

First Office Action in CN201911412392.1; pp. 1-9; Dec. 17, 2021; China National Intellectual Property Administration; No. 6, Xitucheng Lu, Jimenqiao Haidian District, Beijing City, 1000088, China.
(Continued)

*Primary Examiner* — Vu A Vu
(74) *Attorney, Agent, or Firm* — Robert A. Blaha; Smith Tempel Blaha LLC (57) ABSTRACT

An arrangement, a method of manufacturing component carriers and a component carrier are provided. The arrangement includes a central carrier structure having a front side and a back side, a first layer stack having a first surface structure made of another material than the interior of the first layer stack and covered by a first release layer which is attached to the front side, and a second layer stack covered by a second release layer which is attached to the back side.

19 Claims, 4 Drawing Sheets

(52) U.S. Cl.
CPC ... *H01L 25/0657* (2013.01); *H01L 2221/68359* (2013.01); *H01L 2224/2518* (2013.01); *H01L 2224/82005* (2013.01); *H01L 2224/82101* (2013.01); *H01L 2225/06572* (2013.01)

(58) Field of Classification Search
CPC ... H01L 2224/2518; H01L 2224/82005; H01L 2224/82101; H01L 2225/06572; H01L 2224/04105; H01L 2924/3511; H05K 1/185; H05K 1/0271; H05K 3/0097; H05K 2201/10204; H05K 2201/2081; H05K 2203/1469; H05K 2203/1536; H05K 3/007; H05K 3/4682; H05K 1/144; H05K 1/181
USPC .......................................................... 257/766
See application file for complete search history.

(56) References Cited

U.S. PATENT DOCUMENTS

| | | | | |
|---|---|---|---|---|
| 8,729,406 | B2* | 5/2014 | Ko | H05K 3/4682 |
| | | | | 174/263 |
| 8,736,065 | B2* | 5/2014 | Gonzalez | H01L 24/82 |
| | | | | 257/777 |
| 8,937,382 | B2* | 1/2015 | Teh | H01L 21/561 |
| | | | | 257/730 |
| 9,368,401 | B2* | 6/2016 | Teh | H01L 25/50 |
| 9,661,761 | B2* | 5/2017 | Lin | H05K 3/4682 |
| 9,686,870 | B2* | 6/2017 | Teh | H01L 21/6835 |
| 9,949,372 | B2* | 4/2018 | Ishihara | H01L 23/49534 |
| 2008/0196931 | A1 | 8/2008 | Bae et al. | |
| 2010/0288549 | A1 | 11/2010 | Chiang et al. | |
| 2012/0228015 | A1 | 9/2012 | Ho | |
| 2014/0001583 | A1* | 1/2014 | Teh | B81B 3/0005 |
| | | | | 257/417 |
| 2015/0040389 | A1 | 2/2015 | INagaki et al. | |
| 2017/0064835 | A1* | 3/2017 | Ishihara | H05K 3/4697 |
| 2018/0102338 | A1 | 4/2018 | McLellan | |
| 2019/0380211 | A1* | 12/2019 | Lin | H05K 3/4682 |
| 2019/0380212 | A1 | 12/2019 | Chien et al. | |

FOREIGN PATENT DOCUMENTS

| | | |
|---|---|---|
| CN | 107801323 A | 3/2018 |
| CN | 109637981 A | 4/2019 |
| KR | 20090061504 A | 6/2009 |
| TW | 201208020 A | 2/2012 |

OTHER PUBLICATIONS

English translation of cover page of First Office Action in CN201911412392.1; pp. 1-3; Dec. 17, 2021; China National Intellectual Property Administration; No. 6, Xitucheng Lu, Jimenqiao Haidian District, Beijing City, 1000088, China.

Tomezak, A.; Extended European Search Report in Application No. 20 21 4441.6; pp. 1-8; Apr. 23, 2021; European Patent Office, 80298, Munich, Germany.

* cited by examiner

ARRANGEMENT WITH CENTRAL CARRIER AND TWO OPPOSING LAYER STACKS, COMPONENT CARRIER AND MANUFACTURING METHOD

CROSS-REFERENCE TO RELATED APPLICATIONS

This application claims the benefit of the filing date of the Chinese Patent Application No. 201911412392.1, filed Dec. 31, 2019, the disclosure of which is hereby incorporated herein by reference.

TECHNICAL FIELD

The disclosure relates to an arrangement with a central carrier and two opposing layer stacks, to a component carrier and to a manufacturing method.

BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to provide a component carrier with an asymmetric build up which is not prone to warpage. At the same time, the component carrier shall be properly protected against corrosion and the formation of undesired electrically conductive paths, at small effort.

SUMMARY

There may be a need for a component carrier with an asymmetric build up which is not prone to warpage and can be manufactured in a simple and reliable way.

According to an embodiment of the invention, an arrangement is provided which comprises a central carrier structure having a front side and a back side, a first layer stack having a first surface structure made of another material than the interior of the first layer stack (in particular made of another material than all layer structures of the first layer stack being arranged inside the first layer stack without surface access to a main surface of the first layer stack) and covered by a first release layer which is attached to the front side, and a second layer stack covered by a second release layer which is attached to the back side.

According to another exemplary embodiment of the invention, a method of manufacturing component carriers is provided, wherein the method comprises providing a first layer stack having a first surface structure made of another material than the interior of the first layer stack (in particular made of another material than all layer structures of the first layer stack being arranged inside the first layer stack without surface access to a main surface of the first layer stack), connecting the first surface structure of the first layer stack to a front side of a central carrier structure with a first release layer in between, and connecting a second layer stack to a back side of the central carrier structure with a second release layer in between.

According to still another exemplary embodiment of the invention, a component carrier is provided which comprises a layer stack and has a symmetrical stack portion, an asymmetrical stack portion on one side of the symmetrical stack portion, a solder mask and a surface finish on a main surface of the symmetrical stack portion, and a further solder mask and a further surface finish on an opposing main surface of the asymmetrical stack portion, wherein at least one material property is different between the solder mask and the further solder mask and/or at least one material property is different between the surface finish and the further surface finish.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "stack" may particularly denote an arrangement of multiple planar layer structures which are mounted in parallel on top of one another.

In the context of the present application, the term "release layer" may particularly denote a flat structure, such as a film or sheet, which may be connected (in particular laminated) to a surface of a layer stack and which is poorly adhesive with respect for stack material and/or material of a carrier structure. For instance, such a release layer may be a polytetrafluoroethylene (PTFE, Teflon®) layer or may be a layer made of a waxy material. Teflon® is a registered mark of The Chemours Company FC LLC of Wilmington, Del., U.S.A. As a result of these material properties, a stack or component carrier may be easily removed from a carrier structure after having formed a desired layer build-up, for instance by delamination or peeling.

In the context of the present application, the term "surface structure" may particularly denote a body or a material (and preferably a patterned layer) at the surface of the respective stack which is different from materials of layer structures within an interior of the stack, i.e., layer structures without access to the stack surface. Preferably, such a surface structure may be a solder mask or a solder resist, i.e., an electrically insulating material. Alternatively, such a surface structure may also be an electrically conductive material (for instance a surface finish).

In the context of the present application, the term "central carrier structure" may particularly denote a temporary carrier used for carrying layer stacks during asymmetric build-up of the stacks, but not forming part of the readily manufactured component carriers. For instance, such a central carrier structure may be a plate, such as a core (for example made of fully cured core material). Alternatively, the central carrier structure may be a foil or sheet or a further layer stack. Both opposing main surfaces of a plate-shaped carrier structure may be used for attaching a respective layer stack thereon, so that the carrier structure may serve for mechanically supporting the layer stacks during further processing, in particularly during further layer build-up.

According to an embodiment of the invention, an arrangement is provided which is composed of a central carrier structure and two (preferably laminated) layers stacks on opposing main surfaces of the central carrier structure. Advantageously, release layers are attached at exterior main surfaces of the layer stacks at which the layer stacks are connected with the central carrier structure to simplify delamination after completing manufacture of component carriers based on said layer stacks. A respective surface structure (in particular a solder mask) on the release layer side of a respective layer stack and below the respective release layer may be formed already before attaching the respective layer stack to the carrier structure and before forming or attaching the release layer to the respective layer stack. By taking this measure, the solder mask (or another surface structure of material different from the rest of the stack) can also be protected by the release layer and within an interior of the arrangement during processing the arrangement (in particular during further layer build up on arrangement level). Moreover, a proper corrosion protection thanks to the respective surface structure (for instance solder mask) can be created already at a very early stage during manufacture, so that reliable component carriers may be obtained. Furthermore, carrying out a further build-up on the exposed opposing main surfaces of the arrangement after attaching the layer stacks to the carrier structure allows the formation of asymmetric component carriers in which warpage is strongly suppressed, since the additional asymmetric layer structures may be formed symmetrically on both opposing main surfaces of the arrangement. Highly advantageously, this may be combined with the provision of initially symmetric layer stacks at the point of time of attaching them to the central carrier structure, since such kind of layer structures may be formed as well with a low tendency of warpage.

Next, further exemplary embodiments of the arrangement, the component carrier and the method will be explained.

Furthermore, a method of manufacturing component carriers preferably with asymmetrical build-up is provided, wherein the method comprises providing or laminating a for instance laminated (preferably symmetric) first layer stack having a surface with a first release layer (preferably on a first surface structure), providing or laminating a for example laminated (preferably symmetric) second layer stack having a surface with a second release layer (preferably on a second surface structure), attaching the first release layer to a front side of a central carrier, attaching the second release layer to a back side of the central carrier, optionally connecting at least one further layer structure to each exposed surface of the first layer stack and the second layer stack (preferably symmetrically on the first layer stack and the second layer stack), and thereafter detaching the first layer stack from the central carrier at the first release layer to thereby obtain at least one first asymmetric component carrier and detaching the second layer stack from the central carrier at the second release layer to thereby obtain at least one second asymmetric component carrier.

In an embodiment, the first layer stack is a laminated layer stack. Correspondingly, the second layer stack may be a laminated layer stack. In other words, the respective layer stack may be a sequence of stacked electrically insulating layer structures and/or electrically conductive layer structures connected by the application of pressure and/or heat.

In an embodiment, the first surface structure is a first solder mask. Correspondingly, the method may comprise providing a first solder mask as the first surface structure. In the context of the present application, the term "solder mask" may particularly denote a dielectric material which may be applied selectively only on specific surface portions of a component carrier or layer stack as a protection against oxidation or corrosion and ensuring that no undesired electric connections are established. More specifically, a solder mask or solder stop mask or solder resist may be a thin lacquer-like layer of polymer that may be applied to copper traces of a printed circuit board (PCB) for protection against oxidation and to prevent solder bridges from forming between closely spaced solder pads. In particular, a surface of the solder mask may be substantially non-wettable by solder material during soldering. In particular, an electrically insulating solder mask or resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

In an embodiment, the second layer stack has a second surface structure made of another material than the interior of the second layer stack (in particular made of another material than all layer structures of the second layer stack being arranged inside the second layer stack without surface access to a main surface of the second layer stack) and covered by the second release layer. Correspondingly, the method may comprise providing the second layer stack with a second surface structure made of another material than the interior of the second layer stack, and connecting the second surface structure of the second layer stack to the second release layer. In particular, the second surface structure may be a second solder mask. Correspondingly, the method may comprise providing a second solder mask as the second surface structure. Thus, the constitution of the second layer stack may correspond to, preferably may be identical to, the constitution of the first layer stack. This may efficiently suppress warpage.

In an embodiment, at least one of the first layer stack and the second layer stack is a symmetrical stack (in particular directly after assembling the respective layer stack on the carrier structure). Thus, any of the first layer stack and the second layer stack may be composed of electrically conductive layer structures and electrically insulating layer structures being arranged substantially symmetrically with respect to a horizontal plane located vertically centrally in the respective layer stack. As a result, low warpage may be guaranteed for each of the first layer stack and the second layer stack individually. A low tendency of warpage of such symmetric layer stacks may even be obtained in the conventionally more critical scenario of one or more components being embedded in the respective layer stack.

It is also possible that at least one of the first layer stack and the second layer stack is an asymmetrical stack. After having connected two symmetric stacks to the opposing sides of the central carrier structure, one or more additional layer structures may be connected to both opposing main surfaces of the previously symmetric layer stacks, preferably in a symmetric way. As a result, previously or initially symmetric layer stacks may be converted into asymmetrical stacks, while the arrangement maintains symmetrical with respect to the central carrier structure. This may suppress warpage both in the arrangement as well as in the individual layer stacks.

In an embodiment, the first layer stack having the first surface structure covered by the first release layer comprises at least one first component carrier (such as a first printed circuit board, PCB). Correspondingly, the second layer stack preferably having the second surface structure covered by the second release layer may comprise at least one second component carrier (such as a second printed circuit board, PCB). Thus, when the processed respective layer stack is removed from the central carrier structure at the assigned release layer, a component carrier may be obtained which is already provided with a solder mask on a main surface which faces the central carrier structure before delamination. When manufacturing component carriers on panel level, a processed layer stack detached from one side of the carrier structure may already include a plurality of still integrally connected first component carriers, which can be separated for example by mechanically cutting or laser processing. Such a batch manufacture may be highly efficient. It is however alternatively also possible that single component carriers are manufactured on the two opposing main surfaces of the carrier structure.

In an embodiment, the at least one first component carrier has a symmetrical stack portion facing the central carrier structure. Correspondingly, the at least one second component carrier may have a symmetrical stack portion facing the central carrier structure. More specifically, stacked electrically insulating layer structures and electrically conductive layer structures defining a symmetrical portion of the respective component carrier may be substantially mirror symmetrical with respect to a vertically central horizontal plane. Such a symmetrical central region is not prone to warpage.

In an embodiment, the at least one first component carrier has an asymmetrical stack portion spaced with respect to the central carrier structure by the symmetrical stack portion. Correspondingly, the at least one second component carrier may have an asymmetrical stack portion spaced with respect to the central carrier structure by the symmetrical portion of the second component carrier. Said asymmetrical portion may be built up on the first and/or second layer stack after having connected said first and/or second layer stack to the central carrier structure with the first and/or second release layer in between. Hence, the formation of the asymmetrical portion may be carried out after having formed a rigid arrangement with preferably identical and/or symmetrical layer stacks on both opposing main surfaces of the carrier structure, so that warpage may be suppressed. Furthermore, the asymmetrical portion formed on the first layer stack may be identical to a further asymmetrical portion formed on an opposing main surface of the arrangement on the second layer stack, which may further suppress warpage. Taking corresponding measures on both opposing main surfaces of the central carrier structure promotes the protection of the arrangement and its constituents against warpage. By taking this measure, an asymmetric build-up of the first and/or second component carriers may be carried out without the risk of excessive bending.

In an embodiment, at least one component is embedded in at least one of the first layer stack and the second layer stack. In the context of the present application, the term "component" may particularly denote an inlay-type member. Such a component may be arranged in an interior, preferably in a horizontally and/or vertically symmetric way, of the respective layer stack. A component may in particular have an electronic function and may thus be a heat source in view of ohmic losses. For instance, such a component may be a semiconductor die. Embedding a component, for instance a semiconductor die, in a component carrier stack, which may comprise copper, organic resin and optionally glass particles, may create particularly pronounced warpage issues. However, by the described arrangement and the corresponding manufacturing method, any tendency of warpage may be suppressed even in the critical scenario of embedded components.

In an embodiment, a ratio between a length of the at least one embedded component (in particular a semiconductor chip) and a length of a component carrier (for example a printed circuit board) to which said at least one embedded component belongs is larger than 0.3, in particular is larger than 0.4. In particular in the event of the mentioned high die-to-board ratios, issues with warpage of a component carrier with embedded component are particularly pronounced. Thus, the provision of an arrangement with a central carrier structure and component carrier stacks on both opposing main surfaces thereof with the above-described features may be of utmost advantage for reducing warpage.

In an embodiment, said at least one component is embedded in a single core of at least one of the first layer stack and the second layer stack. A core may for example be a thick dielectric central plate being already fully cured when starting to form a build-up on both opposing main surfaces thereof. A single core may be exactly one such dielectric central plate having a thickness which substantially corresponds to a thickness of the component. Thus, embedding the component is possible by forming a hole in the single core to thereby form a cavity in which the component may be embedded. The provision of a central thick core for embedding a component is advantageous in terms of warpage as well.

In an embodiment, at least one of the first surface structure and the second surface structure is a patterned layer. In particular, the respective solder mask or any other kind of surface structure may be provided only on those surface portions of the respective layer stack at which dielectric surface portions are covered as well as covering sections of electrically conductive layer structures which shall not be connected with other electrically conductive layer structures by soldering or the like. Hence, the respective solder mask may be a structured layer of electrically insulating varnish, or the like.

In an embodiment, at least one of the first release layer and the second release layer is a continuous layer. Thus, detaching of the respective layer stack from the central carrier may be promoted and simplified by the respective release layer extending over the entire connection area.

In an embodiment, the first layer stack has a further first surface structure on an opposing stack side compared to the first surface structure. Hence, both opposing main surfaces of the first layer stack (or the at least one first component carrier) may have a respective pattern of solder resist, or another type of surface structure, to properly define or delimit non-solderable and solderable surface portions of the respective electrically conductive layer structures. Advantageously, also the at least one further first surface structure may be formed while the first layer stack (or at least one first component carrier) is still connected to the central carrier structure.

Correspondingly, the second layer stack may have a further second surface structure on an opposing stack side compared to the second surface structure. With respect to these measures, reference is made to the preceding paragraph describing corresponding measures for the first layer stack. Hence, both layer stacks may be provided with a respective additional solder mask, or another type of surface structure, while still being connected with the central carrier structure. This may be accomplished advantageously and efficiently on arrangement level.

Figure 4:
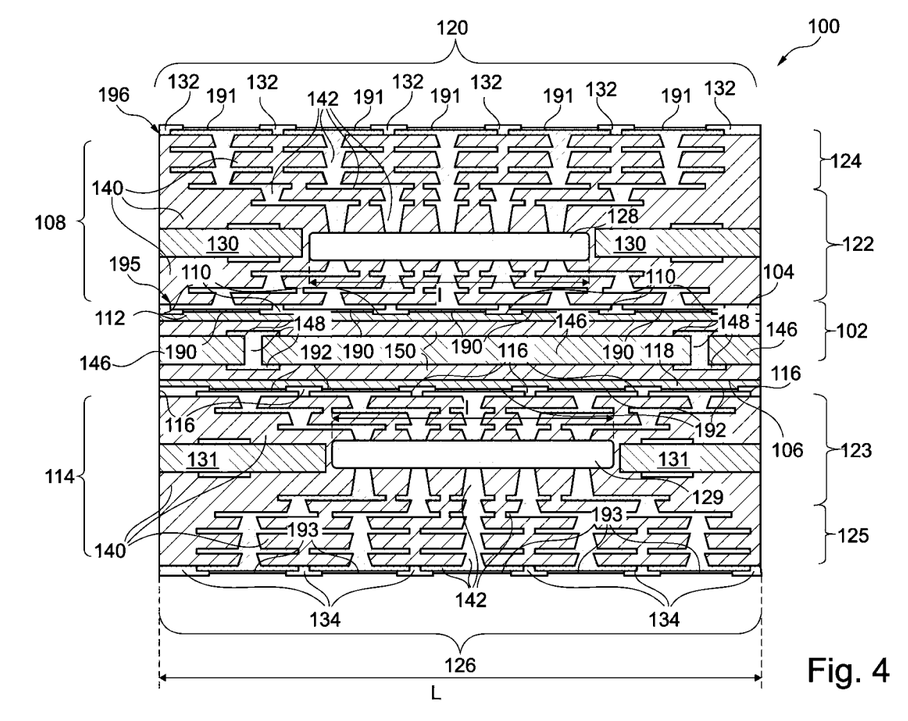

In an embodiment, the method comprises—after said connecting of the layer stacks to the central carrier structure—connecting at least one further layer structure (for instance an asymmetrical stack portion, compare reference signs 124, 125 in FIG. 4) to each exposed main surface of the first layer stack and the second layer stack, and thereafter detaching the first layer stack from the central carrier structure at the first release layer to thereby obtain at least one first asymmetric component carrier and detaching the second layer stack from the central carrier structure at the second release layer to thereby obtain at least one second asymmetric component carrier. When the first layer stack and the second layer stack both have a symmetric and preferably identical build-up when connecting the layer stacks to the central carrier structure, a preferably symmetric attaching of further layer structures to the exposed main surfaces of the first layer stack and the second layer stack may allow the symmetric formation of asymmetric component carriers on both sides of the central carrier structure without pronounced warpage.

In an embodiment, the method comprises covering at least part of exposed electrically conductive surface portions, which are not covered with the first surface structure, of a main surface of the first layer stack, which main surface is partially covered with the first surface structure, with a first surface finish. Preferably, the method further comprises covering at least part of exposed electrically conductive surface portions of an opposing other main surface of the first layer stack with a further first surface finish. In other words, electrically conductive surface portions of the two opposing main surfaces of the first layer stack may be selectively covered with a respective electrically conductive surface finish. Advantageously, the first surface finish and the further first surface finish may differ concerning at least one property, in particular may be made of different materials and/or different thicknesses. This may increase the freedom of design.

Correspondingly, the method may comprise covering at least part of exposed electrically conductive surface portions, which are not covered with the second surface structure, of a main surface of the second layer stack, which main surface is partially covered with the second surface structure, with a second surface finish. Advantageously, the method may comprise covering at least part of exposed electrically conductive surface portions of an opposing other main surface of the second layer stack with a further second surface finish. Reference is made to the preceding paragraph.

Optionally, the method comprises providing a first surface structure on the first layer stack, which first surface structure is partially covered by the first release layer, and providing a second surface structure on the second layer stack, which second surface structure is partially covered by the second release layer.

Further optionally, the method comprises removing the first release layer from the first asymmetric component carrier, and removing the second release layer from the second asymmetric component carrier.

In an embodiment, the method comprises forming a further first surface structure on the first layer stack on an opposing stack side compared to the first surface structure. Correspondingly, the method may comprise forming a further second surface structure on the second layer stack on an opposing stack side compared to the second surface structure. These processes may be carried out before separating the component carriers from the arrangement of the layer stacks and the central carrier structure.

In an embodiment of the component carrier, the at least one material property being different between the solder mask and the further solder mask is a curing rate. In particular, the solder mask may have a higher curing rate than the further solder mask as a consequence of the manufacturing methods described herein.

Additionally or alternatively, the at least one material property being different between the surface finish and the further surface finish may be a material composition. For instance, the surface finish comprises or consists of Electroless Nickel Immersion Gold (ENIG). In contrast to this, the further surface finish may comprise or consist of Electroless Nickel Immersion Palladium Immersion Gold (ENEPIG).

As a result of the manufacturing method as described herein, an outermost electrically conductive layer structure at an exposed main surface of the asymmetrical stack portion may have a larger thickness than an outermost electrically conductive layer structure at an exposed main surface of the symmetrical stack portion.

In an embodiment, each of the first layer stack and the second layer stack comprises one or more electrically insulating layer structures and one or electrically conductive layer structures. For example, the respective layer stack or component carrier may be a laminate of the mentioned electrically insulating layer structures and electrically conductive layer structure(s), in particular formed by applying mechanical pressure and/or thermal energy. The mentioned stack may provide a plate-shaped component carrier capable of providing a large mounting surface for components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded or surface mounted electronic component, can be conveniently assembled, thanks to its small thickness, into or onto a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through holes through the laminate, for instance by laser drilling and/or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a CSP, Chip Size Package). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, a respective electrically insulating layer structure comprises at least one of the group consisting of resin (such as reinforced or non-reinforced resins, for instance epoxy resin or Bismaleimide-Triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (PTFE, Teflon®), a ceramic, and a metal oxide. Reinforcing structures such as webs, fibers or spheres, for example made of glass (multilayer glass) may be used as well. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, a respective electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof.

In an embodiment, the component carrier is a laminate-type component carrier. In such an embodiment, the component carrier is a compound of multiple layer structures which are stacked and connected together by applying a pressing force and/or heat.

The substrate or interposer may consist of at least a layer of glass, Silicon (Si) or a photo-imageable or dry-etchable organic material like epoxy-based Build-Up films or polymer compounds like polyimide, polybenzoxazole, or benzocyclobutene-functionalized polymers.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, it is possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF EXEMPLARY EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment may not be elucidated again at a later position of the description.

Further, spatially relative terms, such as "front" and "back", "above" and "below", "left" and "right", et cetera are used to describe an element's relationship to other element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different from those illustrated in the figures when in use.

Before, referring to the drawings, exemplary embodiments will be described in further detail, some basic considerations will be summarized based on which exemplary embodiments of the invention have been developed.

According to an embodiment of the invention, two (preferably symmetrical) layer stacks of component carrier material (in particular resin, copper and optionally reinforcing glass particles), optionally having at least one embedded component (such as a semiconductor chip), may be attached to both opposing main surfaces of a central carrier structure functioning as a temporary carrier. When attaching the layer stacks to the carrier structure (in particular a carrier plate), they may both already be equipped with a respective solder mask and an exterior release layer at a connection surface facing the carrier structure. Such an arrangement is a proper basis for (preferably symmetrically) connecting further layer structures on both opposing exposed main surfaces thereof, in particular to thereby form component carriers with asymmetrical build-up. After that, the individual component carriers or stacks including multiple integrally connected component carriers may be detached or removed from the central carrier structure. Advantageously, such a manufacturing architecture and in particular such an arrangement have turned out as highly efficient for suppressing warpage, even in a scenario in which the layer stacks include one or more embedded components. Since such a component may be made of a material (in particular silicon) having substantially different physical properties than component carrier material, its embedding may cause specific warpage issues which may be at least suppressed by the described measures.

In particular, an embodiment of the invention provides an arrangement and a corresponding manufacturing concept in which an asymmetrical embedded package configuration may be manufactured utilizing a coreless-like process. In this context, two layer stacks (in particular symmetrical semifinished component carriers) may be manufactured, in particular with embedded component. Solder masks may be formed at this stage of the manufacturing process on at least one main surface of the layer stacks. A release layer or film may be added on each of the semifinished component carriers or layer stacks and may also cover and thereby protect the respective solder mask. Thereafter, the two semifinished component carriers or layer stacks, optionally with embedded component, may be laminated together, at the release layer side, with a carrier structure in between. Additional asymmetric layers or layer structures may be formed and processed on both exposed surfaces of the obtained arrangement. Thereafter, a separation of the readily finished component carriers may be carried out by detaching them at the respective release layer. After a final testing procedure, the component carriers with embedded component, asymmetric build up and already manufactured solder masks are ready for use. As a result, stable and low warpage component carriers with asymmetric build-up and embedded component may be obtained.

In particular, a manufacturing process for manufacturing component carriers using an arrangement according to an embodiment of the invention may include the following processes:

1. Manufacturing of two symmetrical layer stacks (such as preforms of component carriers or wiring boards), in particular with a built-in electronic component. A patterned solder mask and a continuous release layer may be attached to one main surface of each of the layer stacks.

2. The two symmetrical layer stacks or wiring boards are attached with their release layer side to each of the upper and lower sides of a carrier structure or support sheet, to thereby obtain an arrangement according to an embodiment of the invention.

3. Additional insulation layers and wiring layers may be laminated on the exposed surfaces of the wiring boards with a built-in electronic component. Thereby, asymmetric component carriers with embedded component are created. In particular after that, further patterned solder masks may be formed on the exposed main surfaces of each connected layer stack or wiring board.

4. The component carriers or boards can then be separated from the carrier structure or support sheet at the respective release layer. The release layers may be optionally removed to thereby obtain readily manufactured component carriers with asymmetric build-up and embedded component. Advantageously, such component carriers do not show excessive warpage.

FIG. 1 to FIG. 5 illustrate cross-sectional views of structures obtained during carrying out a method of manufacturing component carriers 120, 126 with asymmetric build-up and embedded component 128, 129 based on an arrangement 100 according to an embodiment of the invention.

Figure 1:
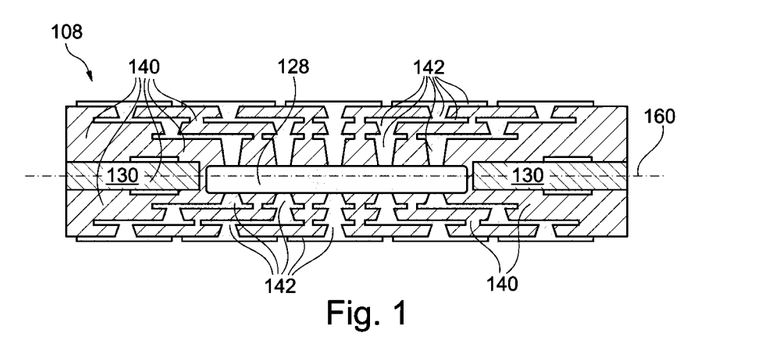
FIG. 1, FIG. 2, FIG. 3, FIG. 4 and FIG. 5 illustrate cross-sectional views of structures obtained during carrying out a method of manufacturing component carriers based on an arrangement according to an embodiment of the invention.

Referring to FIG. 1, a laminated layer stack 108 with embedded component 128 (for instance a semiconductor chip) is shown. To obtain layer stack 108 according to FIG. 1, a hole may be cut in a central core 130 (for instance made of FR4 material) and may be closed at a bottom side by a sticky tape (not shown). Thereafter, the component 128 may be placed in a cavity delimited by the hole and closed at the bottom side by the sticky tape. The component 128 may be attached to the sticky tape and may then be glued in place by laminating further electrically insulating layer structures 140 and further electrically conductive layer structures 142 to the top side. Thereafter, the sticky tape may be removed, since it is no more needed for providing stability. Moreover, further electrically insulating layer structures 140 and electrically conductive layer structures 142 may be laminated in particular on the bottom side to thereby obtain the symmetric first layer stack 108 shown in FIG. 1. Thus, the illustrated layer stack 108 is obtained which is constituted as an embedded symmetrical package.

The obtained first layer stack 108 comprises electrically conductive layer structures 142 and electrically insulating layer structures 140. The electrically insulating layer structure 140 can comprise resin (such as epoxy resin) and optionally reinforcing particles such as glass fibers or glass spheres. The electrically insulating layer structures 140 may for instance be made of fully cured FR4 material, i.e., material having resin which is already completely cross-linked and is not capable of re-melting or becoming flowable by the application of mechanical pressure and/or heat. The electrically conductive layer structures 142 may be metal layers such as copper foils and may be copper filled laser vias.

The substantially symmetrical configuration of the first layer stack 108 relates to a vertically central horizontal symmetry plane 160 illustrated in FIG. 1. Since the material distribution above and below the central symmetry plane 160 is substantially identical and almost mirror symmetric, the illustrated first layer stack 108 can be considered as symmetrical. Such a symmetrical first layer stack 108 is not prone to warpage, although having embedded therein semiconductor-type component 128.

Figure 2:
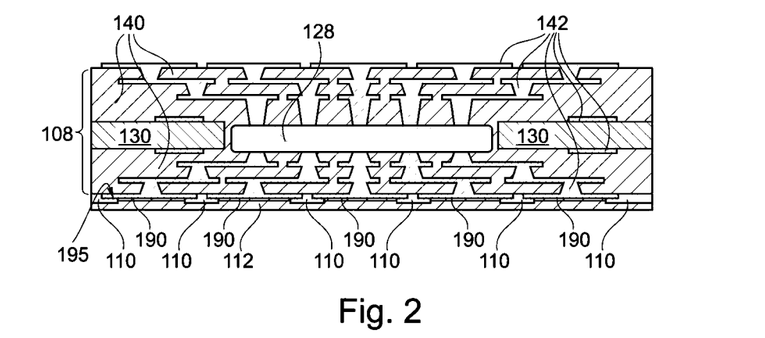

Referring to FIG. 2, a patterned first surface structure 110 in form of a solder mask is formed on one exposed main surface of the symmetric laminated first layer stack 108. The first surface structure 110 is applied on surface portions of the electrically insulating layer structures 140 as well as partially on connected surface portions of the electrically conductive layer structures 142 so that the entire lower main surface of the first layer stack 108 is composed of exposed portions of the electrically conductive layer structures 142 and the first surface structure 110.

The method also comprises covering exposed electrically conductive surface portions of the electrically conductive layer structures 142 on a lower main surface according to FIG. 2 with a first surface finish 190, for instance by ENIG plating. Thus, electrically conductive surface portions of the lower main surface of the first layer stack 108 which are not covered with the solder mask-type first surface structure 110 are covered with the first surface finish 190.

After that, a first release layer 112 is formed on said exposed main surface of the laminated first layer stack 108 to thereby cover the first surface structure 110 and the first surface finish 190 on the previously exposed portions of the electrically conductive layer structures 142 adjacent to the first surface structure 110. The first release layer 112 is made of a material which shows a poor adhesion with respect to material of the first layer stack 108 as well as to material of a central carrier structure 102 described below in further detail.

For instance, the first surface structure 110 and the first release layer 112 may be printed on the bottom main surface of the first layer stack 108, i.e., on the lower layer count side of the product.

Hence, a solder mask, ENIG and the first release layer 112 are formed on the lower layer count side of the first layer stack 108. As indicated by reference sign 195, a relatively thin copper layer may be used for the lowermost electrically conductive layer structure 142.

Figure 3:
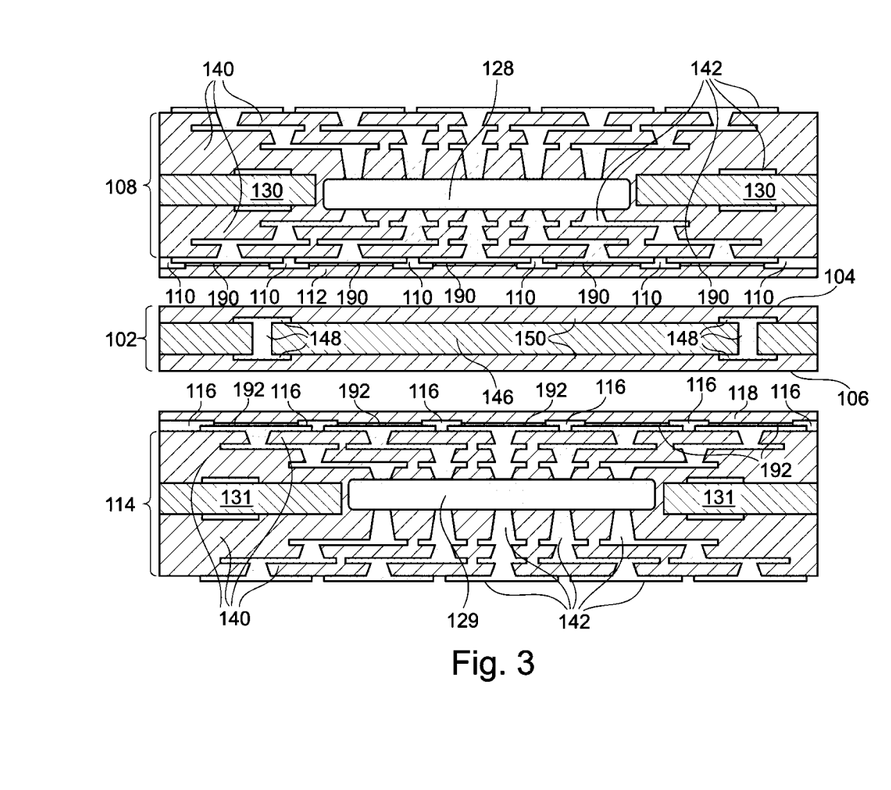

Referring to FIG. 3, the first release layer 112 is placed to be subsequently attached to a front side 104 of a central carrier structure 102 so that the first release layer 112 forms the interface between the central carrier structure 102 and the first layer stack 108.

Furthermore, a second layer stack 114 is provided which is constituted correspondingly to the first layer stack 108. The laminated second layer stack 114 is provided with a continuous second release layer 118 (which may have the same properties as the first release layer 112) on a patterned second surface structure 116 in form of a further solder mask (which may have the same properties as the first surface structure 110) and on a second surface finish 192 (for instance made as well of ENIG). Stacked electrically conductive layer structures 142 and electrically insulating layer structures 140 of the second layer stack 114 as well as an embedded component 129 may be formed correspondingly as in the first layer stack 108. The component 129 is embedded in a central core 131 (which may have the same properties as the central core 130). The second release layer 118 is to be attached to a back side 106 of the central carrier structure 102 so that the second release layer 118 forms the interface between the central carrier structure 102 and the second layer stack 114.

Figure 5:
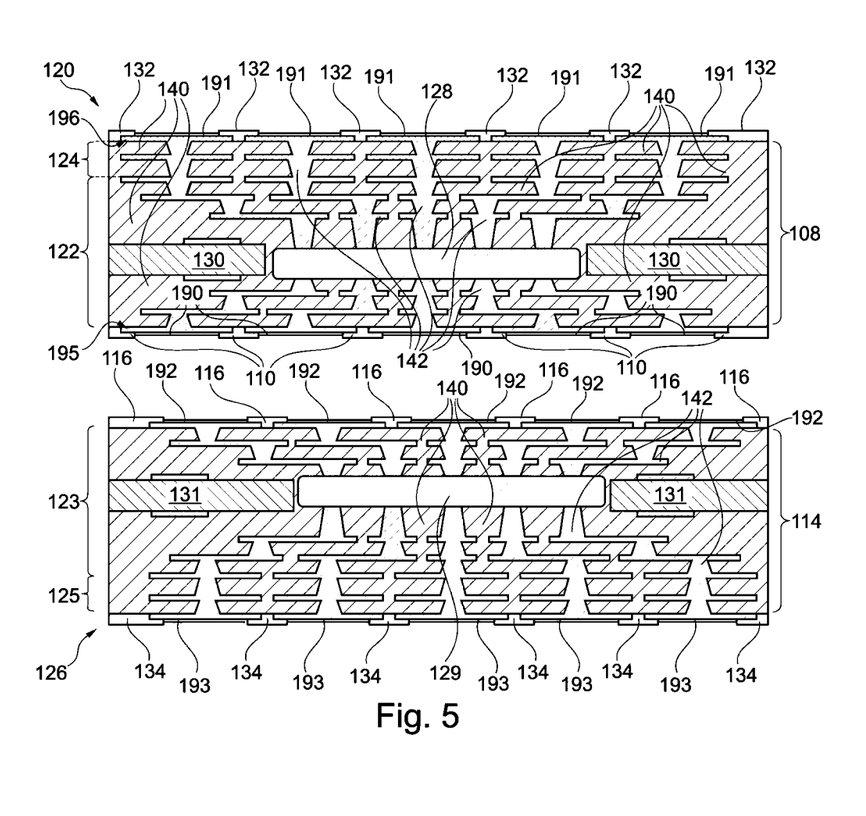

The central carrier structure 102 serves as a temporary carrier supporting the laminated layer stacks 108, 114 during the subsequent stages of the manufacturing process. For instance, carrier structure 102 may be a dielectric core 146 of fully cured FR4 material which is provided with electrically conductive layer structures 148 (for instance made of copper) and electrically insulating layer structures 150 (for instance made of FR4). The temporary carrier in form of carrier structure 102 does not form part of the readily manufactured component carriers 120, 126, which are shown in FIG. 5.

The semi-finished packages with embedded component 128, 129 shown in FIG. 3 above and below the dummy core forming carrier structure 102 may be laminated together, i.e., may be connected by the application of pressure and/or heat. The result is an arrangement 100 according to an embodiment of the invention.

Referring to FIG. 4, further electrically conductive layer structures 142 and further electrically insulating layer structures 140 may be connected to each exposed surface of the first layer stack 108 and the second layer stack 114 while remaining attached to central carrier structure 102. Said connection may be carried out by lamination, i.e., the application of pressure and/or heat. In other words, it is possible to produce the following layer structures 140, 142 during a further build-up to constitute an asymmetrical configuration of the obtained component carriers 120, 126, for instance printed circuit boards (PCBs).

As a result of this manufacturing process, the illustrated arrangement 100 according to an embodiment of the invention is obtained. Said arrangement 100 comprises the central carrier structure 102, the laminated first layer stack 108 having first surface structure 110 covered by first release layer 112 being attached to the front side 104 of the carrier structure 102, and the laminated second layer stack 114 having second surface structure 116 covered by second release layer 118 and being attached to the back side 106 of the carrier structure 102.

In order to obtain arrangement 100 according to FIG. 4, a patterned further first surface structure 132 is formed on an exposed main surface of the first layer stack 108, i.e., on an exposed opposing stack side compared to the first surface structure 110. Correspondingly, the second layer stack 114 may be provided, on its exposed main surface, with a patterned further second surface structure 134 on an exposed opposing stack side compared to the second surface structure 116.

Moreover, the manufacturing method comprises covering exposed electrically conductive surface portions of the uppermost electrically conductive layer structure 142 of the first layer stack 108 with a further first surface finish 191, for example ENEPIG plating. Correspondingly, exposed electrically conductive surface portions of the lowermost electrically conductive layer structure 142 of the second layer stack 114 may be covered with a further second surface finish 193, for example ENEPIG plating. Thus, different surface finishing processes may be used for the exposed main surfaces of the arrangement 100 as compared to the opposing main surfaces of the layer stacks 108, 114 attached to the central carrier structure 102. Furthermore, as mentioned by reference sign 196, a thick copper layer may be used at the exterior main surfaces of the arrangement 100. In other words, a thickness of the copper layer according to reference sign 195 may be smaller than a thickness of the copper layer according to reference sign 196. The same design rule can be selected for the second layer stack 114.

As shown, each of the first layer stack 108 and the second layer stack 114 has a symmetrical stack portion 122, 123 facing the central carrier structure 102. Each of the symmetrical stack portions 122, 123 is formed before connection of the respective layer stack 108, 114 to the carrier structure 102. Moreover, each of the layer stacks 108, 114 comprises a respective asymmetrical stack portion 124, 125 which is spaced with respect to the central carrier structure 102 by the respective symmetrical stack portion 122, 123. The asymmetrical stack portions 124, 125 are formed after connection of the respective layer stack 108, 114 to the carrier structure 102.

As shown, a respective electronic component 128, 129 is embedded in each of the first layer stack 108 and the second layer stack 114. More specifically, the respective component 128, 129 is embedded in a respective single core 130, 131 of a respective one of the first layer stack 108 and the second layer stack 114. A ratio between a length I of the respective embedded component 128, 129 and a length L of the respective component carrier 120, 126 to which said at least one embedded component 128, 129 belongs is larger than 0.3. Thus, component carriers 120, 126 have a high die-to-package ratio and are thus particular prone to warpage. Thanks to the embedding of the respective component 128, 129 while the respective layer stack 108, 114 has still been symmetric, the tendency of the component carriers 120, 126 to warp may be significantly reduced.

Referring to FIG. 5, the readily manufactured component carriers 120, 126 are shown. They can be obtained by detaching the first layer stack 108 from the central carrier 102 at the first release layer 112 and by detaching the second layer stack 114 from the central carrier 102 at the second release layer 118. Thus, the readily manufactured component carriers 120, 126 or boards may be separated from the temporary central carrier 102. When the component carriers 120, 126 are formed on panel level, each of the detached first layer stack 108 and second layer stack 114 may be separated into a plurality of separate component carriers 120, 126. The surface finish 190-193 (such as ENIG, ENEPIG or chemical tin) may be optionally applied to the surface portions of the respective component carrier 120, 126 before or after singularization.

The obtained component carriers 120, 126 may have different thicknesses of the outermost electrically conductive layer structures 142, see reference signs 195, 196. Copper thickness on the last created surface layer may thus be higher compared to earlier created. Each of the component carriers 120, 126 may have surface finish 190-193 on both opposing main surfaces thereof being made of different materials, for instance ENIG and ENEPIG. The curing rate of the solder masks according to reference signs 110, 132, 116, 134 may be different. For instance, a curing rate (i.e., a percentage of the material being fully cured and being therefore no more capable of being re-melted) of material of the solder mask-type surface structures 132, 134 may be less than 91%, whereas a curing rate of material of the solder mask-type surface structures 110, 116 may be larger than 98%. In other words, the curing rate of the firstly formed solder mask surface may be essentially higher as compared to the later formed solder mask surface, which is verifiable by a cross linking test. The described manufacturing process thus increases the freedom of design for a component carrier designer.

As shown in the figures, exposed surface areas of electrically conductive layer structures 142 of the component carriers 120, 126 may be selectively covered with a respective electrically conductive surface finish 190-193 (for instance ENEPIG, ENIG or OSP). Opposing main surfaces of a respective component carrier 120 or 126 may be covered with the same or preferably different surface finishes 190-193. Different surface finishes 190-193 may differ concerning material and/or thickness. It is possible that surface finish 190-193 is applied at a main surface of a respective stack 108, 114 before the connection to the central carrier structure 102 or after removal from the central carrier structure 102.

An exemplary embodiment of the invention may finalize a first surface of a printed circuit board with embedded component prior to an attachment to a temporary carrier core. By taking this measure, it can be advantageously ensured that the surface finishing type as well as its thickness, and the solder mask type and its thickness can be easily modified between the top and bottom layers. In particular, this may make it possible to use a special high Ni thickness ENEPIG surface for the top layer only (wherein in particular the surface does not touch the carrier core). The other side surface may be defined as an ENIG or OSP surface, more generally having another surface finish. It would be not possible to produce such a component carrier with a conventional approach, as a corresponding masking is not compatible with an ENEPIG process, as well as with other surface finish manufacturing processes.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. An arrangement, comprising:
   a central carrier structure having a front side and a back side;
   a first layer stack comprising a first surface structure made of another material than the interior of the first layer stack, at least one electrically conductive layer structure defining, at least partially, an outer surface of the first layer stack, wherein the first surface structure is applied on surface portions of the electrically conductive layer structure, wherein a first surface finish is applied on surface portions of the electrically conductive layer structure not covered by the first surface structure, and wherein a first release layer is applied on the first surface structure and is attached to the front side; and
   a second layer stack covered by a second release layer which is attached to the back side;
   wherein the first surface finish is a solderable layer comprising electrically conductive cover material covering electrically conductive layer structures on an external surface of the first layer stack.

2. The arrangement according to claim 1, comprising at least one of the following features:
   the first layer stack is a laminated layer stack;
   the second layer stack is a laminated layer stack;
   the first surface structure is a first solder mask.

3. The arrangement according to claim 1, wherein the second layer stack has a second surface structure made of another material than the interior of the second layer stack and covered by the second release layer.

4. The arrangement according to claim 3, comprising at least one of the following features:
   the second surface structure is a second solder mask;
   the second layer stack having the second surface structure covered by the second release layer comprises at least one second component carrier, wherein the at least one second component carrier has a symmetrical stack portion facing the central carrier structure, wherein the at least one second component carrier has an asymmetrical stack portion spaced with respect to the central carrier structure by the symmetrical portion;
   the second surface structure is a patterned layer;
   the second layer stack has a further second surface structure on an opposing stack side compared to the second surface structure, wherein the further second surface structure is a solder mask.

5. The arrangement according to claim 1, wherein the at least one of the first layer stack and the second layer stack is a symmetrical stack or an asymmetrical stack.

6. The arrangement according to claim 1, wherein the first layer stack having the first surface structure covered by the first release layer comprises at least one first component carrier, wherein the at least one first component carrier has a symmetrical stack portion facing the central carrier structure, wherein the at least one first component carrier has an asymmetrical stack portion spaced with respect to the central carrier structure by the symmetrical stack portion.

7. The arrangement according to claim 1, wherein at least one component is embedded in at least one of the first layer stack and the second layer stack.

8. The arrangement according to claim 7, comprising at least one of the following features:
   a ratio between a length of the at least one embedded component and a length of a component carrier of the first layer stack or the second layer stack, to which component carrier said at least one embedded component belongs, is larger than 0.3;
   said at least one component is embedded in a single core of at least one of the first layer stack and the second layer stack.

9. The arrangement according to claim 1, comprising at least one of the following features:
   the first surface structure is a patterned layer;
   at least one of the first release layer and the second release layer is a continuous layer;
   the first layer stack has a further first surface structure on an opposing stack side compared to the first surface structure, wherein the further first surface structure is a solder mask.

10. A method of manufacturing component carriers, comprising:
    providing a first layer stack having a first surface structure made of another material than the interior of the first layer stack;
    connecting the first surface structure of the first layer stack to a front side of a central carrier structure with a first release layer in between; and
    connecting a second layer stack to a back side of the central carrier structure with a second release layer in between,
    wherein the method further comprises applying a surface finish to at least one of the first layer stack and the second layer stack, wherein the surface finish is a solderable layer comprising electrically conductive cover material covering electrically conductive layer structures on an external surface of the layer stack.

11. The method according to claim 10, further comprising:
    providing a first solder mask as the first surface structure.

12. The method according to claim 10, further comprising:
    providing the second layer stack with a second surface structure made of another material than the interior of the second layer stack; and
    connecting the second surface structure of the second layer stack to the second release layer.

13. The method according to claim 12, further comprising:
    providing a second solder mask as the second surface structure.

14. The method according to claim 10, wherein after said connecting to the central carrier structure, connecting at least one further layer structure to each exposed main surface of the first layer stack and the second layer stack; and
    thereafter detaching the first layer stack from the central carrier structure at the first release layer to thereby obtain at least one first asymmetric component carrier and detaching the second layer stack from the central carrier structure at the second release layer to thereby obtain at least one second asymmetric component carrier.

15. The method according to claim 10, comprising at least one of the following features:
    wherein the method comprises embedding a first component in the first layer stack;
    wherein the method comprises embedding a second component in the second layer stack.

16. The method according to claim 10, wherein the method comprises covering at least part of exposed electrically conductive surface portions of an opposing other main surface of the first layer stack with a further first surface finish.

17. The method according to claim 12, further comprising:
covering at least part of exposed electrically conductive surface portions, which are not covered with the second surface structure of a main surface of the second layer stack, which main surface is partially covered with the second surface structure, with a second surface finish, wherein the method comprises covering at least part of exposed electrically conductive surface portions of an opposing other main surface of the second layer stack with a further second surface finish.

18. A component carrier with a layer stack, the component carrier comprising:
a symmetrical stack portion;
an asymmetrical stack portion on one side of the symmetrical stack portion;
a solder mask and a surface finish on a main surface of the symmetrical stack portion;
a further solder mask and a further surface finish on an opposing main surface of the asymmetrical stack portion;
wherein at least one material property is different between the solder mask and the further solder mask and/or at least one material property is different between the surface finish and the further surface finish,
wherein the surface finish is a solderable layer comprising electrically conductive cover material covering electrically conductive layer structures on an external surface of the symmetrical stack portion and the further surface finish is a solderable layer comprising electrically conductive cover material covering electrically conductive layer structures on an external surface of the asymmetrical layer stack.

19. The component carrier according to claim 18, comprising at least one of the following features:
wherein the at least one material property being different between the solder mask and the further solder mask is a curing rate;
wherein the solder mask has a higher curing rate than the further solder mask;
wherein the at least one material property being different between the surface finish and the further surface finish is a material composition;
wherein the surface finish comprises or consists of Electroless Nickel Immersion Gold;
wherein the further surface finish comprises or consists of Electroless Nickel Immersion Palladium Immersion Gold;
a component embedded in the symmetrical stack portion;
wherein an outermost electrically conductive layer structure at an exposed main surface of the asymmetrical stack portion has a larger thickness than an outermost electrically conductive layer structure at an exposed main surface of the symmetrical stack portion.

* * * * *